United States Patent
Raman et al.

(10) Patent No.: US 8,816,745 B1
(45) Date of Patent: Aug. 26, 2014

(54) EQUALIZER CIRCUITRY INCLUDING BOTH INDUCTOR BASED AND NON-INDUCTOR BASED EQUALIZER STAGES

(75) Inventors: Sangeeta Raman, San Jose, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 167 days.

(21) Appl. No.: 13/316,361

(22) Filed: Dec. 9, 2011

(51) Int. Cl.
*H03L 5/00* (2006.01)

(52) U.S. Cl.
USPC ....................................... 327/306

(58) Field of Classification Search
USPC ................................. 327/306–311
See application file for complete search history.

(56) References Cited

U.S. PATENT DOCUMENTS

| | | | | |
|---|---|---|---|---|
| 7,916,780 | B2* | 3/2011 | Lee | 375/232 |
| 8,335,249 | B1* | 12/2012 | Su et al. | 375/232 |
| 2003/0227348 | A1* | 12/2003 | Eden | 333/99 S |
| 2008/0247452 | A1* | 10/2008 | Lee | 375/232 |

* cited by examiner

*Primary Examiner* — Daniel Rojas
(74) *Attorney, Agent, or Firm* — Mauriel Kapouytian Woods LLP; Ararat Kapouytian

(57) ABSTRACT

An equalizer circuitry that includes both inductor based and non-inductor based equalizer stages is provided. In one implementation, the equalizer circuitry includes a first equalizer circuitry including a first inductor based equalizer stage and a first non-inductor based equalizer stage coupled to the first inductor based equalizer stage. In one implementation, the equalizer circuitry further includes a second equalizer circuitry including a plurality of inductor based equalizer stages, where the plurality of inductor based equalizer stages includes the first inductor based equalizer stage. In one implementation, the first equalizer circuitry further includes a second inductor based equalizer stage coupled to the first inductor based equalizer stage and the first non-inductor based equalize stage.

17 Claims, 4 Drawing Sheets

EQUALIZER CIRCUITRY INCLUDING BOTH INDUCTOR BASED AND NON-INDUCTOR BASED EQUALIZER STAGES

BACKGROUND

Embodiments of the present invention relate to equalizer circuitry.

In some transmission links (e.g., high speed transmission links), the input data (e.g., differential input data) is degraded due to frequency dependent losses. The frequency dependent losses include skin effect losses and dielectric losses of the transmission media. If not rectified, these losses can lead to intersymbol interference (ISI), which results in an increased bit error rate (BER). Equalizer circuitry (including equalizer stages) in the receiver is used to compensate for these losses so that subsequent stages (e.g., a sense amplifier in the slicer stage) can correctly detect the signal polarity.

One type of equalizer circuitry is a non-inductor based equalizer circuitry. A non-inductor based equalizer circuitry includes a plurality of non-inductor based equalizer stages. This type of equalizer circuitry is generally used in lower data rate applications (e.g., applications up to 14 Giga bits per second (Gbps)). It is to be noted that, in half rate architectures, the equalizer circuitry provides an alternating current (AC) gain at half the data rate. Thus, a non-inductor based equalizer circuitry is generally used to provide equalizer AC gains of up to 7 Giga Hertz (GHz). The non-inductor based equalizer circuitry, however, cannot achieve higher bandwidths because the capacitive loading on the output node starts limiting the bandwidth.

Another type of equalizer circuitry is an inductor based equalizer circuitry. An inductor based equalizer circuitry includes a plurality of inductor based equalizer stages. An inductor based equalizer circuitry achieves AC gain peaking at a higher bandwidth (e.g., for data rates greater than 20 Gbps). In the inductor based equalizer circuitry, the passive inductors help tune out the capacitive loading on the output node and increase the bandwidth of the AC gain. As inductors are not easily tunable, the bandwidth of an inductor based equalizer cannot be reduced to support lower data rates. Furthermore, inductor based equalizer circuitry have a larger footprint in layout.

SUMMARY

An embodiment of the present invention provides equalizer circuitry that includes both inductor based and non-inductor based equalizer stages. With both inductor based and non-inductor based equalizer stages powered on, the equalizer circuitry provides an AC gain at a lower frequency. However, with the inductor based equalizer stage powered on and the non-inductor based equalizer stage powered off, the equalizer circuitry provides an AC gain at a higher frequency. As a result, embodiments of the equalizer circuitry of the present invention support a wider range of data rate applications.

In one aspect, an embodiment of the present invention provides an equalizer circuitry including a first equalizer circuitry including a first inductor based equalizer stage and a first non-inductor based equalizer stage coupled to the first inductor based equalizer stage. In one embodiment, the equalizer circuitry further includes a second equalizer circuitry including a plurality, of inductor based equalizer stages, where the plurality of inductor based equalizer stages includes the first inductor based equalizer stage. In one embodiment, the plurality of inductor based equalizer stages includes a second inductor based equalizer stage coupled to the first inductor based equalizer stage and a third inductor based equalizer stage coupled to the second inductor based equalizer stage. Also, in one embodiment, the first equalizer circuitry further includes a second inductor based equalizer stage coupled to the first inductor based equalizer stage and the first non-inductor based equalizer stage.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use embodiments of the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
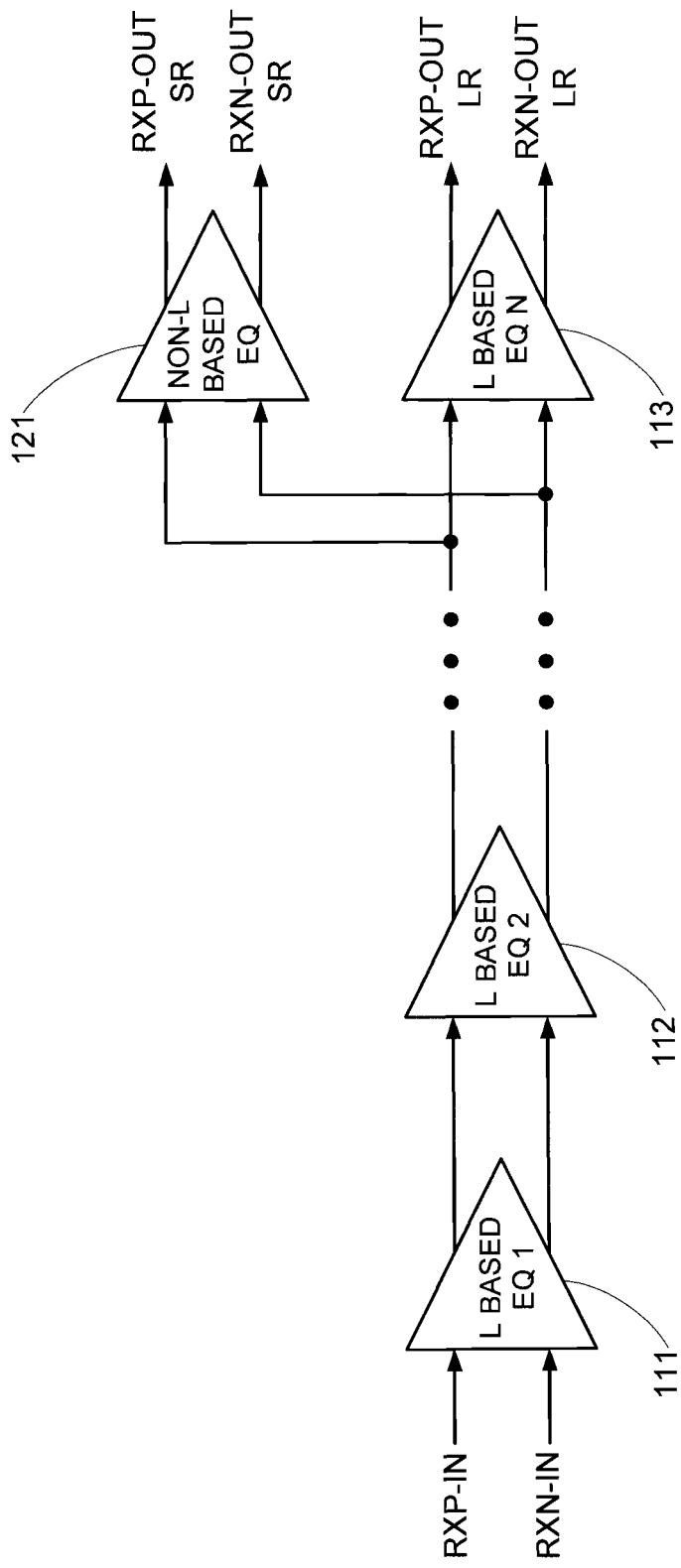
FIG. 1 is a simplified schematic block diagram of one embodiment of an equalizer circuitry of the present invention.

FIG. 1 is a simplified schematic block diagram of one embodiment of an equalizer circuitry of the present invention. In FIG. 1, equalizer circuitry 100 includes N inductor (L) based equalizer (EQ) stages 111 to 113 and non-inductor based equalizer stage 121, where N is an integer greater than or equal to 1. In one embodiment, N is equal to 3. Equalizer circuitry 100 includes two equalizer circuitries. One equalizer circuitry includes the N inductor based EQ stages 111 to 113 and no non-inductor based EQ stages. This equalizer circuitry may herein be referred to as a long reach (LR) equalizer circuitry, which in one embodiment is suitable for LR applications (e.g., backplane applications). The other equalizer circuitry includes inductor based EQ stages 111 and 112 and non-inductor based equalizer stage 121. This equalizer circuitry may herein be referred to as a short reach (SR) equalizer circuitry, which in one embodiment is suitable for SR applications (e.g., chip to chip and chip to module applications). Equalizer circuitry 100 may also herein be referred to as equalizer 100 or equalizer filter 100.

As equalizer circuitry 100 includes both an LR equalizer circuitry and an SR equalizer circuitry, it supports both LR and SR applications. In one embodiment, LR applications correspond to higher data rate applications (e.g., 28 Gbps applications) whereas SR applications correspond to lower data rate applications (e.g., 14 Gbps applications). It is to be noted that, in one embodiment, the equalizer circuitry provides an AC gain at half the data rate. Thus, in the case of a 28 Gbps data rate application, the AC gain of the equalizer circuitry would be at 14 GHz. Similarly, in the case of a 14 Gbps data rate application, the AC gain of the equalizer circuitry would be at 7 GHz.

The inputs to equalizer circuitry 100 are RXP-IN and RXN-IN, which are differential voltage signals. Equalizer circuitry 100 has two sets of output signals, which may or may not be available concurrently. In other words, in one embodiment, while one set of output signals is available, the other set of output signals is not available. In another embodiment, both sets of output signals maybe available together. One set of output signals is RXP-OUT LR and RXN-OUT LR, which are differential voltage signals. The other set of output signals is RXP-OUT SR and RXN-OUT SR, which are also differential voltage signals. In one embodiment, output signals RXP-OUT SR and RXN-OUT SR provide AC gain of the input signals RXP-IN and RXN-N at a lower peak frequency than that of the AC gain that output signals RXP-OUT LR and RXN-OUT LR provide of input signals RXP-IN and RXN-N. As their name suggests, in one embodiment, output signals RXP-OUT LR and RXN-OUT LR are suitable for long reach applications (e.g., backplane data transmissions). Similarly, as their name suggests, in one embodiment, output signals RXP-OUT SR and RXN-OUT SR are suitable for short reach applications (e.g., chip to chip or chip to module data transmissions). This is because output signals RXP-OUT SR and RXN-OUT SR have slightly lower AC gain than output signals RXP-OUT LR and RXN-OUT LR. As used herein, chip to chip and chip to module data transmissions refer to chip to chip and chip to module data transmissions that are accomplished without traversing the backplane. In one embodiment, chip to chip and chip to module data transmissions are chip to chip and chip to module data transmissions on the same board.

In an alternative embodiment, equalizer circuitry 100 may be such that it does not include inductor based equalizer stage 113. In such an embodiment, there would be one set of output signals from equalizer circuitry 100. That set of output signals would be output from non-inductor based equalizer stage 121. That set of output signals can be either suitable for LR applications or SR applications. If non-inductor based equalizer stage 121 is activated (i.e., by being turned on), then the output of equalizer circuitry 100 would be more suitable for SR applications as the AC gain of equalizer circuitry 100 would have a slightly lower AC gain. Moreover, with non-inductor based equalizer stage 121 activated, equalizer circuitry 100 would provide AC gain at a lower frequency (e.g., near 7 GHz). On the other hand, if non-inductor based equalizer stage 121 is deactivated (i.e., by being turned off), then the output of equalizer circuitry 100 would be more suitable for LR applications as the AC gain of equalizer circuitry 100 would have a slightly higher AC gain. Moreover, with non-inductor based equalizer stage 121 deactivated, equalizer circuitry 100 would provide AC gain at a higher frequency (e.g., near 14 GHz). When non-inductor based equalizer stage 121 deactivated, it acts as a buffer and its AC gain is not enabled.

Figure 2:
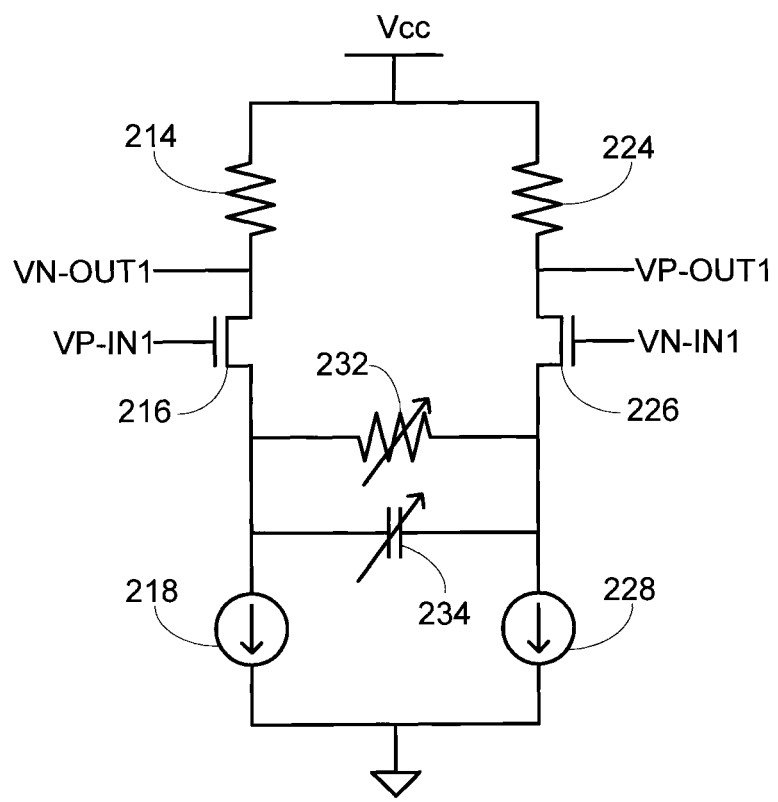
FIG. 2 is a detailed diagram of an embodiment of a non-inductor based equalizer stage of the equalizer circuitry of FIG. 1.

FIG. 2 is a detailed diagram of an embodiment of a non-inductor based equalizer stage of the equalizer circuitry of FIG. 1. In FIG. 2, non-inductor based equalizer stage 200 includes load resistors 214 and 224, differential transistors 216 and 226, current sources 218 and 228, degenerating resistor 232, and degenerating capacitor 234, which are coupled as shown. Equalizer stage 200 may also herein be referred to as a differential amplifier. Differential transistors 216 and 226 may also herein be referred to as differential switches or a differential pair. In one embodiment, current sources 218 and 228 are programmable current sources, which may also herein be referred to as variable current sources. In one embodiment, current sources 218 and 228 are programmable in user mode. In other words, they are programmable during runtime.

As shown in FIG. 2, load resistors 214 and 224 are coupled to voltage supply Vcc. Also, load resistors 214 and 224 are coupled to output terminals for providing output voltages VN-OUT1 and VP-OUT 1, respectively, and to differential transistors 216 and 226, respectively. Differential transistors 216 and 226 are in turn coupled to current sources 218 and 228, respectively. Differential transistors 216 and 226 are also coupled to input terminals for receiving input voltages VP-IN1 and VN-IN1, respectively. Degenerating resistor 232 and degenerating capacitor 234 are coupled to differential transistors 216 and 226 and current sources 218 and 228, which are coupled to ground.

The inputs to equalizer stage 200 are VP-IN1 and VN-IN1, which are collectively a differential voltage signal. Equalizer stage 200 receives VP-IN1 and VN-IN1 and outputs VP-OUT1 and VN-OUT1, which are also collectively a differential voltage signal. In one embodiment, equalizer stage 200 amplifies the AC components of VP-IN1 and VN-IN1. In other words, in one embodiment, equalizer stage 200 provides gain for VP-IN1 and VN-IN1 when they are transitioning from a binary high voltage signal to a binary low voltage signal or vice versa. On the other hand, in one embodiment, equalizer stage 200 provides no gain for the DC components of VP-IN1 and VN-IN1. In other words, in one embodiment, equalizer stage 200 provides no gain for VP-IN1 and VN-IN1 when they are not transitioning from a binary high voltage signal to a binary low voltage signal or vice versa. In another embodiment, equalizer stage 200 may provide a gain for the DC components of VP-IN1 and VN-IN1.

Figure 3:
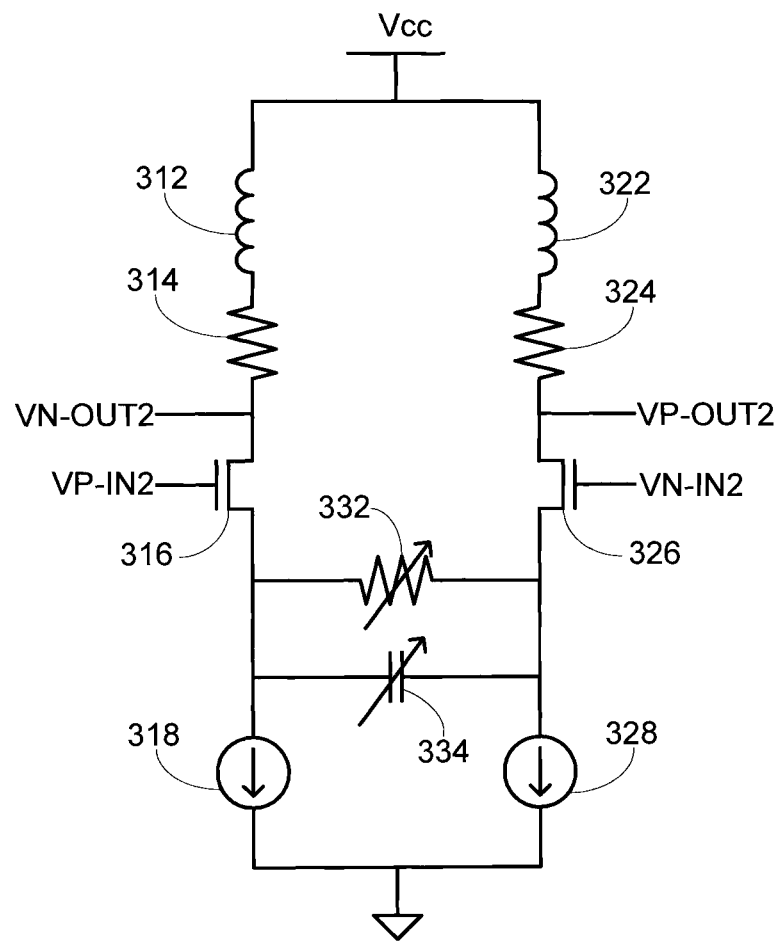
FIG. 3 is a detailed diagram of an embodiment of an inductor based equalizer stage of the equalizer circuitry of FIG. 1.

FIG. 3 is a detailed diagram of an embodiment of an inductor based equalizer stage of the equalizer circuitry of FIG. 1. In FIG. 3, inductor based equalizer stage 300 includes inductors 312 and 322, load resistors 314 and 324, differential transistors 316 and 326, current sources 318 and 328, degenerating resistor 332, and degenerating capacitor 334, which are coupled as shown. In one embodiment, inductors 312 and 322 are passive inductors. Equalizer stage 300 may also herein be referred to as a differential amplifier. Differential transistors 316 and 326 may also herein be referred to as differential switches or a differential pair. In one embodiment, current sources 318 and 328 are programmable current sources. In one embodiment, current sources 318 and 328 are programmable in user mode.

As shown in FIG. 3, inductors 312 and 322 are coupled to voltage supply Vcc. Inductors 312 and 322 are also coupled to load resistors 314 and 324, respectively. Also, load resistors 314 and 324 are coupled to output terminals for providing output voltages VN-OUT2 and VP-OUT 2, respectively, and to differential transistors 316 and 326, respectively. Differential transistors 316 and 326 are in turn coupled to current sources 318 and 328, respectively. Differential transistors 316 and 326 are also coupled to input terminals for receiving input voltages VP-IN2 and VN-IN2, respectively. Degenerating resistor 332 and degenerating capacitor 334 are coupled to differential transistors 316 and 326 and current sources 318 and 328, which are coupled to ground.

The inputs to equalizer stage 300 are VP-IN2 and VN-IN2, which are collectively a differential voltage signal. Equalizer stage 300 receives VP-IN2 and VN-IN2 and outputs VP-OUT2 and VN-OUT2, which are also collectively a differential voltage signal. In one embodiment, equalizer stage 300 amplifies the AC components of VP-IN2 and VN-IN2. In other words, in one embodiment, equalizer stage 300 provides gain for VP-IN2 and VN-IN2 when they are transitioning from a binary high voltage signal to a binary low voltage signal or vice versa. On the other hand, in one embodiment, equalizer stage 300 provides no gain for the DC components of VP-1N2 and VN-IN2. In other words, in one embodiment, equalizer stage 300 provides no gain for VP-IN2 and VN-IN2 when they are not transitioning from a binary high voltage signal to a binary low voltage signal or vice versa. In another embodiment, equalizer stage 300 may provide a gain for the DC components of VP-IN2 and VN-IN2.

An equalizer circuitry according to an embodiment of the present invention might be included in a variety of integrated circuits (ICs), including ICs that are programmable logic devices (PLDs). PLDs (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names) provide the advantages of fixed ICs with the flexibility of programmable ICs. Such devices typically provide an "off the shelf" device having at least a portion that can be programmed to meet a user's specific needs. Application specific integrated circuits (ASICs) have traditionally been fixed ICs. However, it is possible to provide an ASIC that has a portion or portions that are programmable. Thus, it is possible for an IC device to have qualities of both an ASIC and a PLD. The term PLD as used herein will be considered broad enough to include such devices.

PLDs have configuration elements that may be programmed or reprogrammed. Configuration elements may be realized as random access memory (RAM) bits, flip-flops, electronically erasable programmable read-only memory (EEPROM) cells, or other memory elements. Placing new data into the configuration elements programs or reprograms the PLD's logic functions and associated routing pathways. Configuration elements that are field programmable are often implemented as RAM cells (sometimes referred to a "configuration RAM" (CRAM)). However, many types of configurable elements may be used including static or dynamic RAM (SRAM or DRAM), electrically erasable read-only memory (EEROM), flash, fuse, and anti-fuse programmable connections. The programming of configuration elements can also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by other PLD elements.

Figure 4:
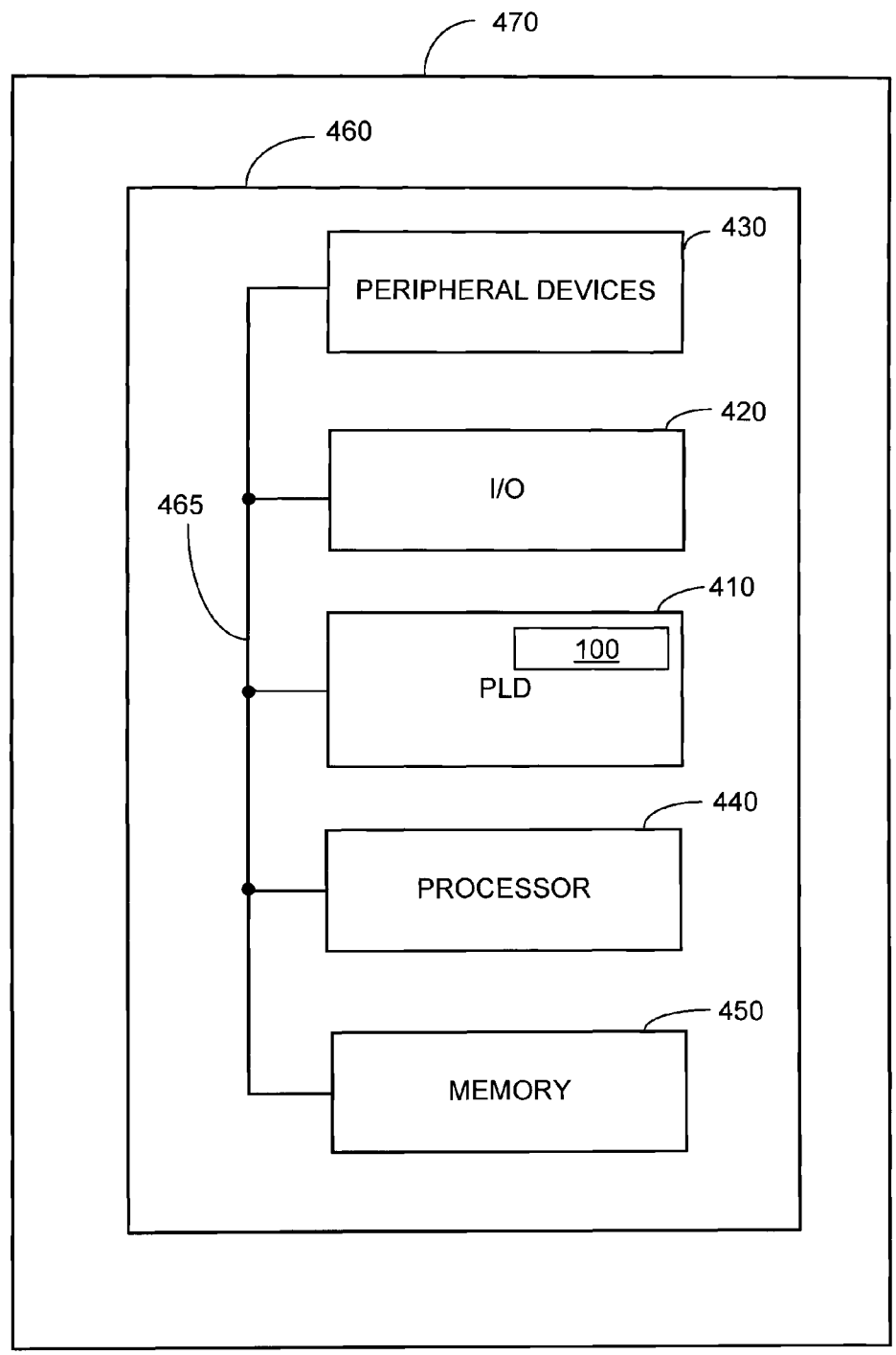
FIG. 4 illustrates an exemplary data processing system including an exemplary programmable logic device in which embodiments of the equalizer circuitry in accordance with the present invention might be implemented.

FIG. 4 illustrates an exemplary data processing system including an exemplary PLD in which embodiments of the equalizer circuitry in accordance with the present invention might be implemented. In FIG. 4, data processing system 400, among other things, includes PLD 410. PLD 410, in turn, includes equalizer circuitry 100. In one embodiment, equalizer circuitry 100 is on the same die/chip as PLD 410. In one embodiment, the logic for equalizer circuitry 100 is supported by the programmable PLD core of PLD 410. Data processing system 400 may include one or more of the following components: processor 440, memory 450, input/output (I/O) circuitry 420, and peripheral devices 430. These components are coupled together by system bus 465 and are populated on circuit board 460 which is contained in end-user system 470. A data processing system such as system 400 may include a single end-user system such as end-user system 470 or may include a plurality of systems working together as a data processing system.

System 400 can be used in a wide variety of applications, such as computer networking, data networking, instrumentation, video processing, digital signal processing (DSP), or any other application where the advantage of using programmable or reprogrammable logic is desirable. PLD 410 can be used to perform a variety of different logic functions. For example, PLD 410 can be configured as a processor or controller that works in cooperation with processor 440 (or, in alternative embodiments, a PLD might itself act as the sole system processor). PLD 410 may also be used as an arbiter for arbitrating access to a shared resource in system 400. In yet another example, PLD 410 can be configured as an interface between processor 440 and one of the other components in system 400. It should be noted that system 400 is only exemplary.

In one embodiment, system 400 is a digital system. As used herein a digital system is not intended to be limited to a purely digital system, but also encompasses hybrid systems that include both digital and analog subsystems.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An equalizer circuitry comprising:
   a first equalizer circuitry including:
      a first inductor based equalizer stage; and
      a first non-inductor based equalizer stage coupled to the first inductor based equalizer stage, wherein the first inductor based equalizer stage comprises:
      inductors;
      load resistors coupled to the inductors;
      a differential pair coupled to the load resistors;
      a pair of current sources coupled to the differential pair;
      a degenerating resistor coupled to the differential pair; and
      a degenerating capacitor coupled to the differential pair.

2. The equalizer circuitry of claim 1 further comprising:
   a second equalizer circuitry including a plurality of inductor based equalizer stages;
   wherein the plurality of inductor based equalizer stages includes the first inductor based equalizer stage.

3. The equalizer circuitry of claim 2, wherein the first equalizer circuitry supports chip to chip or chip to module data transmissions and the second equalizer circuitry supports backplane data transmissions.

4. The equalizer circuitry of claim 2, wherein the plurality of inductor based equalizer stages includes:
   a second inductor based equalizer stage coupled to the first inductor based equalizer stage; and
   a third inductor based equalizer stage coupled to the second inductor based equalizer stage.

5. The equalizer circuitry of claim 1, wherein the first equalizer circuitry further comprises a second inductor based equalizer stage coupled to the first inductor based equalizer stage and the first non-inductor based equalizer stage.

6. The equalizer circuitry of claim 1, wherein the first non-inductor based equalizer stage comprises:
   load resistors;

a differential pair coupled to the load resistors;
a pair of current sources coupled to the differential pair;
a degenerating resistor coupled to the differential pair; and
a degenerating capacitor coupled to the differential pair.

7. A programmable logic device including the equalizer circuitry of claim 1.

8. A digital system comprising a programmable logic device including the equalizer circuitry of claim 1.

9. An equalizer circuitry comprising:
 (a) a first equalizer circuitry including:
  (i) a first inductor based equalizer stage;
  (ii) a second inductor based equalizer stage coupled to the first inductor based equalizer stage; and
  (iii) a first non-inductor based equalizer stage coupled to the second inductor based equalizer stage; and
 (b) a second equalizer circuitry including:
  (i) the first inductor based equalizer stage;
  (ii) the second inductor based equalizer stage; and
  (iii) a third inductor based equalizer stage coupled to the second inductor based equalizer stage.

10. The equalizer circuitry of claim 9, wherein the first equalizer circuitry is operable to support chip to chip or chip to module data transmissions and the second equalizer circuitry is operable to support backplane data transmissions.

11. The equalizer circuitry of claim 9, wherein the first non-inductor based equalizer stage comprises:
 load resistors;
 a differential pair coupled to the load resistors;
 a pair of current sources coupled to the differential pair;
 a degenerating resistor coupled to the differential pair; and
 a degenerating capacitor coupled to the differential pair.

12. The equalizer circuitry of claim 9, wherein each of the first, second, and third inductor based equalizer stages comprises:
 inductors;
 load resistors coupled to the inductors;
 a differential pair coupled to the load resistors;
 a pair of current sources coupled to the differential pair;
 a degenerating resistor coupled to the differential pair; and
 a degenerating capacitor coupled to the differential pair.

13. A programmable logic device including the equalizer circuitry of claim 9.

14. A digital system comprising a programmable logic device including the equalizer circuitry of claim 9.

15. A method of equalization, the method comprising:
 using a first equalizer circuitry including a first inductor based equalizer stage and a first non-inductor based equalizer stage coupled to the first inductor based equalizer stage; and
 using a second equalizer circuitry including a plurality of inductor based equalizer stages, wherein the plurality of inductor based equalizer stages includes:
  the first inductor based equalizer stage;
  a second inductor based equalizer stage coupled to the first inductor based equalizer stage; and
  a third inductor based equalizer stage coupled to the second inductor based equalizer stage,
 further wherein the first equalizer circuitry further comprises the second inductor based equalizer stage coupled to the first inductor based equalizer stage and the first non-inductor based equalizer stage.

16. The method of claim 15, wherein the first equalizer circuitry supports chip to chip or chip to module data transmissions and the second equalizer circuitry supports backplane data transmissions.

17. The method of claim 15 further comprising:
 turning on the first inductor based equalizer stage; and
 turning on the first non-inductor based equalizer stage.

\* \* \* \* \*